United States Patent [19]

Baukol et al.

[11] Patent Number: 4,533,870

[45] Date of Patent: Aug. 6, 1985

[54] METHOD FOR TESTING MULTI-SECTION PHOTO-SENSITIVE DETECTORS

[75] Inventors: David E. Baukol, Pacific; John W. Dorsey-Palmateer, Tacoma, both of Wash.

[73] Assignee: The Boeing Company, Seattle, Wash.

[21] Appl. No.: 444,904

[22] Filed: Nov. 29, 1982

[51] Int. Cl.³ ............................................. G01R 31/26
[52] U.S. Cl. ..................................................... 324/158 D
[58] Field of Search .............. 324/158 D, 52, 62 R, 324/158 R; 338/17; 250/203 R, 209; 307/311; 136/290

[56] References Cited

U.S. PATENT DOCUMENTS

| | | | |
|---|---|---|---|
| 2,554,225 | 5/1951 | Taylor | 136/290 |
| 2,609,644 | 9/1952 | Brown, Jr. et al. | 29/593 X |
| 2,678,401 | 5/1954 | Jaeger | 338/17 |
| 2,970,411 | 2/1961 | Trolander | 324/158 D X |
| 3,013,232 | 12/1961 | Lubin | 338/17 |
| 3,039,056 | 6/1962 | Many et al. | 324/158 D |
| 3,325,723 | 6/1967 | Grayson | 134/290 X |
| 3,350,635 | 10/1967 | Hesch | 136/290 X |
| 3,428,403 | 2/1969 | Konishi | 338/17 X |
| 3,435,328 | 3/1969 | Allen | 136/290 X |
| 3,680,024 | 7/1972 | Tashiro et al. | 338/17 |
| 4,021,112 | 5/1977 | Wilson | 324/158 D |
| 4,163,194 | 7/1979 | Ross | 136/290 X |
| 4,184,111 | 1/1980 | Turner | 136/290 X |
| 4,287,473 | 9/1981 | Sawyer | 324/158 D X |
| 4,301,409 | 11/1981 | Miller et al. | 324/158 D |
| 4,342,959 | 8/1982 | Skilling | 324/73 PC |
| 4,459,547 | 7/1984 | Miller | 324/158 R |

FOREIGN PATENT DOCUMENTS

| | | | |
|---|---|---|---|
| 864193 | 9/1981 | U.S.S.R. | 324/158 R |
| 993174 | 1/1983 | U.S.S.R. | 324/158 R |

OTHER PUBLICATIONS

IBM Technical Disclosure Bulletin, vol. 23, No. 3, "Solar Cell Grid Resistance Measurement", Paz, O. et al., Aug. 1980, pp. 1053-1055.

Primary Examiner—Steward J. Levy
Assistant Examiner—Stephen M. Baker
Attorney, Agent, or Firm—James P. Hamley; Bernard A. Donahue

[57] ABSTRACT

A method for determining proper operation of a multi-section photo-sensitive detector (10) includes measuring (102) the cathode-anode dark resistance of each section and rejecting the detector (104, 108) if any section measures less than a predetermined value or if the ratio of the dark resistance of any section to the section having the highest dark resistance (106) exceeds a specified level. Each detector is also subjected to anode-to-anode or cathode-to-cathode dark resistance testing for both adjacent (110) and non-adjacent (124) sections, with testing based on comparisons between section pair readings and the sum of the cathode-anode dark resistances of each section in the tested pair (114, 128).

2 Claims, 3 Drawing Figures

METHOD FOR TESTING MULTI-SECTION PHOTO-SENSITIVE DETECTORS

BACKGROUND OF THE INVENTION

The present invention pertains to the optical detector art and, more particularly, to a method for testing a multi-section photo-sensitive detector.

Multi-section photo-sensitive detectors find numerous uses. In the tooling art, for example, extensive use is being made of quadrant detectors, i.e. a detector comprised of four individual photo-sensitive sections sharing a common substrate. In precise machining operations, the aligning of machine tables and tools is accomplished by directing a laser beam from a fixed, known point at a target located on the movable object. Each quadrant of the detector passes a current proportional to impinging light. Thus, upon all four quadrants passing the same current, the beam is known to be striking the precise central portion of the detector, thereby establishing alignment.

As will be understood, it is critical for proper operation of such an aligning system that the various quadrants of the detector track one another and that there be minimal cross-talk between quadrants.

One approach to assuring that the photo-detector meets these requirements has involved measuring a series of individual photo-sensitive detector sections and, based on the data, selecting four sections which track. These four sections are then affixed to a common substrate. This approach is expensive and time-consuming.

An alternate approach has been to place an untested integrated quadrant detector in its manufacturing application and check it out at the job site. If the unit does not perform satisfactorily, it is then replaced with another detector until a suitable one is found. This sort of hit and miss operation is, also, very expensive and time-consuming.

There is a long-felt need in this art, therefore, for a method of testing multi-section, integrated photosensitive detectors, which method assures proper operation of the detector in its intended application and does not require labor-intensive testing.

SUMMARY OF THE INVENTION

It is an object of this invention, therefore, to provide an improved method for the testing of multi-section photo-sensitive detectors.

Briefly, according to the invention, a method for testing multi-section photo-sensitive detectors comprises a first step of measuring the cathode-anode dark resistance of each section and rejecting the detector in response to any such section measuring less than a predetermined value. The ratio of the cathode-anode dark resistance of each section to that section having the highest cathode-anode dark resistance is evaluated. The detector is rejected in response to any such ratio being less than a predetermined value. The cathode-cathode (or anode-anode) dark resistance of each adjacent pair of sections is then measured and the detector rejected in response to any such resistance being less than a predetermined value. The cathode-cathode (or anode-anode) dark resistance of each adjacent section pair is compared with the sum of the cathode-anode dark resistances for each section in a pair, with a detector rejected in response to a predetermined disparity in this comparison. The ratio is then evaluated of the cathode-cathode (or anode-anode) dark resistance of each adjacent section pair with the cathode-cathode (or anode-anode) dark resistance of that section pair having the highest cathode-cathode (or anode-anode) dark resistance. The detector is rejected if the ratio is less than a predetermined value.

DETAILED DESCRIPTION OF THE PREFERRED EMBODIMENT OF THE INVENTION

The present inventors have discovered the fact that the operational characteristics of a multi-section photo-sensitive detector may be determined solely by measuring the dark resistance of the detector. This discovery, not known heretofore, has been verified by both empirical testing and theoretical modelling. Thus, the present method involves measuring the various dark resistances of a photo-sensitive detector.

Figure 1:
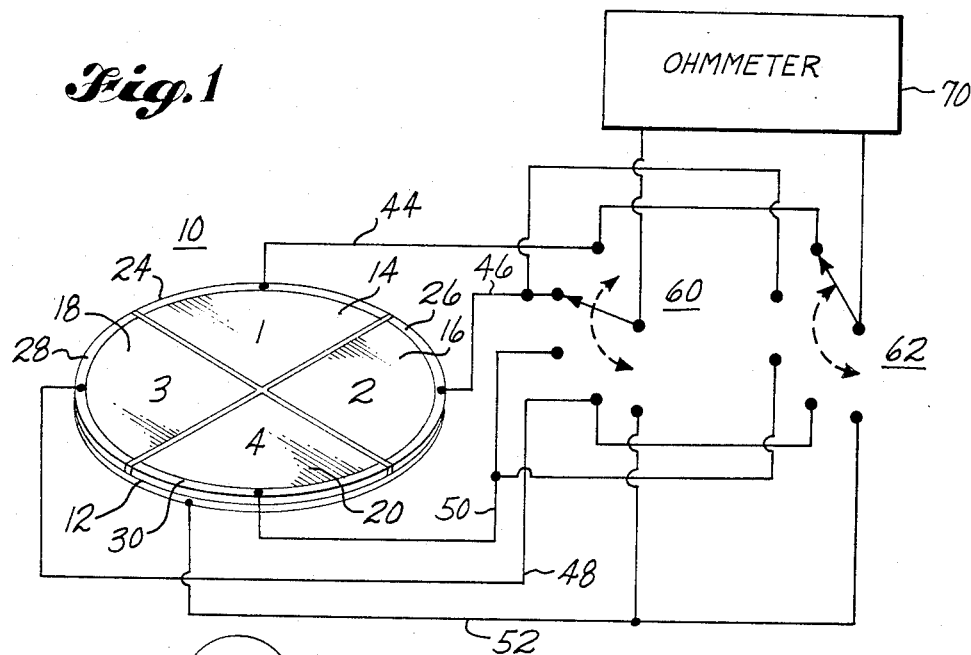
FIG. 1 is a diagram illustrating the apparatus for measuring a quadrant detector in accordance with the invention.

FIG. 1 is a schematic diagram illustrating the apparatus used to perform the present method of testing a multi-section photo-sensitive detector. Here, a quadrant detector 10 is shown. The quadrant detector 10 is comprised of a common, conductive substrate 12 on to which are deposited four photo-sensitive regions 14, 16, 18 and 20. Electrodes 24, 26, 28 and 30 electrically connect to the photo-sensitive layer. In the present case, the photo-sensitive materials are arranged such that the anode portion of each photo-sensitive section 14, 16, 18 and 20 is connected in common on the substrate 12, whereas the upper electrodes 24, 26, 28 and 30 electrically connect to the cathode portions. It should be understood, however, that in alternate constructions the upper electrodes could electrically connect to the anode sections of the detectors, whereas the common substrate connects to the cathode of each section.

A series of conductive leads 44, 46, 48 and 50 connect to the cathode electrodes 24, 26, 28 and 30, respectively. These leads, in turn, connect to contacts provided on variable position switches 60, 62. Also connected to corresponding contacts of switches 60, 62 is the common anode substrate, via conductive lead 52. The movable contact of each switch 60, 62 connects to an input of an ohmmeter 70.

The switches 60, 62 allow the resistance between any two contacts on the detector 10 to be measured. These resistance readings are taken on the dark resistance of the detector 10, that is, all readings taken are with absolutely no light impinging upon the detector. For purposes of the discussion hereafter describing the precise testing method for the photodetector, the quadrant sections are identified as 1, 2, 3 and 4 as shown in FIG. 1.

Figure 2A:
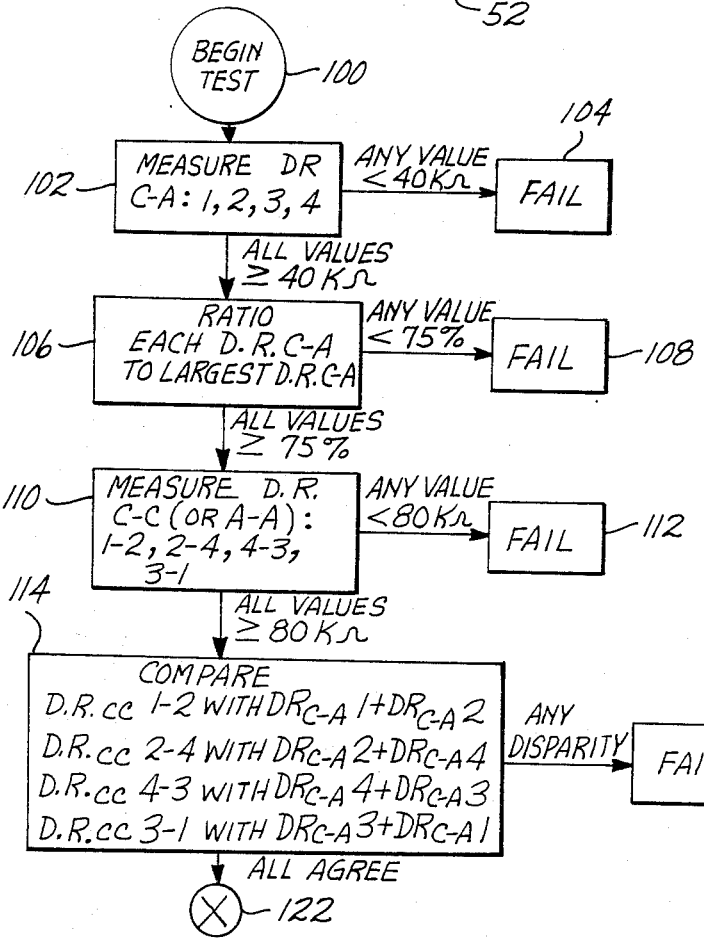
FIGS. 2A and 2B are logic flow diagrams illustrating each step performed during the method of the preferred embodiment of the invention.
Figure 2B:
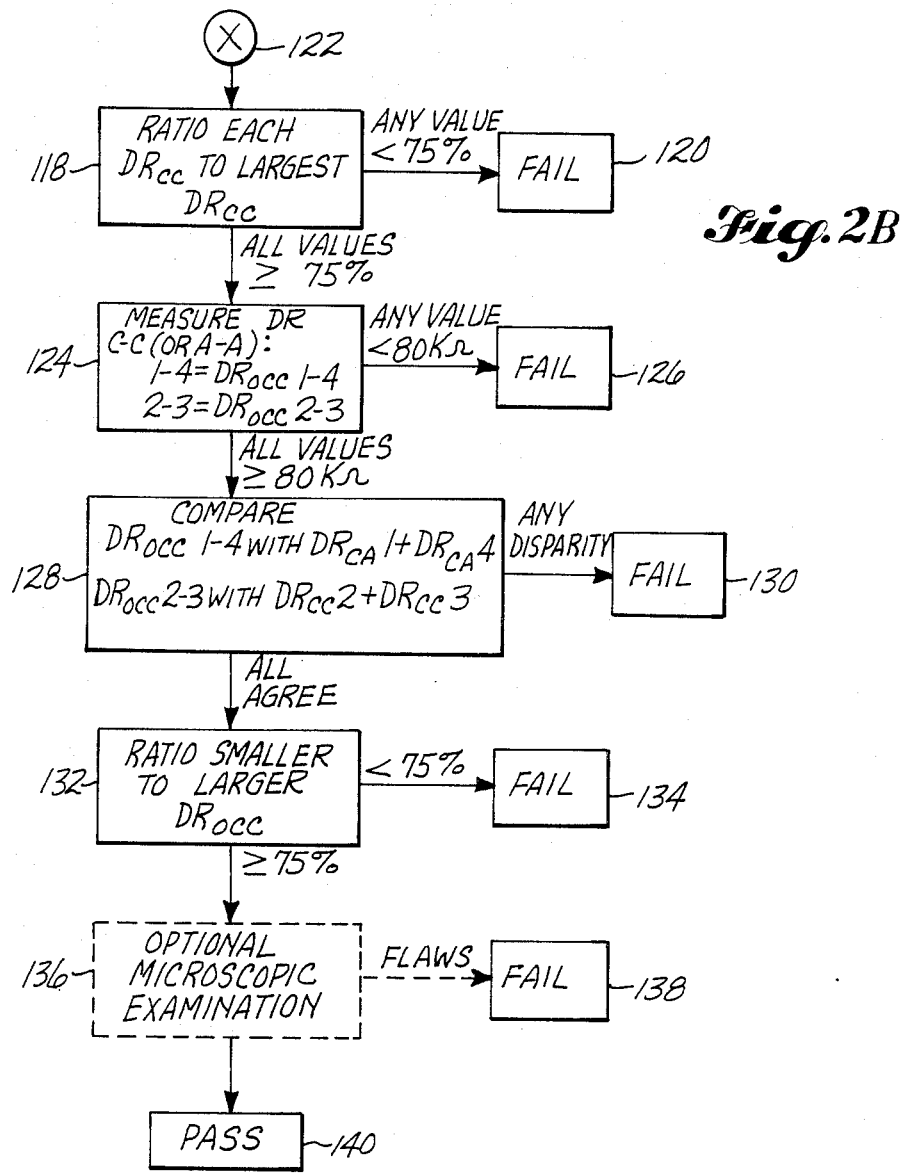

FIGS. 2A and 2B illustrate the precise method for measuring the various dark resistances of the detector 10 of FIG. 1 and thereby indicate the manner in which the switches 60, 62 of FIG. 1 are positioned to achieve the desired test configuration.

Thus, at position 100 the test is begun. First, at position 102, the dark resistance (DR) is measured between the cathode and anode (C-A) for each quadrant 1, 2, 3 and 4. If any section measures less than 40 kilo-ohms, the detector fails at position 104. If, however, all sections measure greater than 40 kilo-ohms, test position 106 is entered. Here, the ratio is taken of the cathode-to-anode dark resistance, as measured at position 102, of each section to that section having the highest cathode-to-anode dark resistance. If any ratio is less than 75%, the unit is indicated as a fail at 108. If all ratios are greater than, or equal to, 75% the test proceeds.

At position 110 the dark resistance is measured between the cathode-to-cathode (for common anode detectors) or between the anode-to-anode (for common cathode detectors) electrodes of adjacent sections. Thus, in the present example, the cathode-to-cathode dark resistance is measured between sections 1 and 2, 2 and 4, 4 and 3, and 3 and 1. If any of these measurements results in a value less than 80 kilo-ohms, the detector is indicated as a fail at 112. If all values are greater than 80 kilo-ohms, the test proceeds.

At block 114 a series of comparisons are evaluated. The cathode-to-cathode dark resistance of an adjacent pair, as measured in block 110, is compared with the sum of the cathode-to-anode dark resistances of each section of a pair as measured in block 102. For a properly operating detector, the sum of the two cathode-to-anode resistances should approximately equal the cathode-to-cathode dark resistance for those sections. This comparison is performed for each adjacent pair as measured in position 110. If any disparity is found in this comparison, the detector is indicated as a fail at block 116. If agreement is found in all comparisons, the test continues at 122.

At position 118 a ratio is evaluated of the dark resistance cathode-to-cathode of each adjacent pair as measured in block 110 with respect to the highest cathode-to-cathode dark resistance measured in position 110. If any ratio is less than 75%, the unit is indicated as a fail at block 120, whereas if all ratios are greater than, or equal to, 75% the test continues.

A subsequent test at position 124 causes a dark resistance measurement of opposite quadrants. Thus, the cathode-to-cathode dark resistance between quadrants 1 and 4, and 2 and 3 is determined. If either measurement is less than 80 kilo-ohms, the unit is indicated as a fail at 126, whereas both values equalling or exceeding 80 kilo-ohms results in subsequent testing.

At block 128 the cathode-to-cathode dark resistance of each opposite pair 1-4 and 2-3 is compared with the sum of the cathode-to-anode dark resistances for each section in a pair. If any disparity is found, the unit is indicated as a fail at block 130, whereas if the comparisons result in agreement, the test is continued.

At block 132 a ratio is taken of the smaller to the larger of the dark resistances measured in block 124. If this ratio is less than 75%, the unit is indicated as a fail at block 134, whereas if the ratio is greater than, or equal to, 75%, testing continues.

At block 136 an optional microscopic examination is indicated. Such check is a conventional microscopic examination to identify any flaws in the photo-detector. If flaws are found, the unit is indicated as a fail at 138, whereas otherwise, if the unit has passed all tests, it is indicated as a pass at block 140.

The above-described method has proved an effective procedure for identifying photo-sensitive detectors which will perform satisfactorily in application. The testing may be performed quickly and inexpensively, and, quite clearly, lends itself to automatic testing methods.

Whereas a preferred embodiment of the invention has been described in detail, it should be apparent that many modifications and variations thereto are possible without deviating from the true spirit and scope of the invention.

For example, whereas specific values have been shown for the testing of one particular photo-sensitive detector, these values are not intended to in any way limit the scope of the invention.

We claim:

1. A method for testing multi-section photo-sensitive detectors comprising the steps of:
   (a) measuring the cathode-anode dark resistance of each section and rejecting the detector in response to any section measuring less than a predetermined value;
   (b) evaluating the ratio of the cathode-anode dark resistance of each section to the cathode-anode dark resistance of that section having the highest cathode-anode dark resistance, and rejecting the detector in response to any such ratio being less than a predetermined value;
   (c) measuring the cathode-cathode or anode-anode dark resistance of each adjacent pair of sections and rejecting the detector in response to any such resistance being less than a predetermined value;
   (d) comparing the cathode-cathode or anode-anode dark resistance of each adjacent section pair with the sum of the cathode-anode dark resistances for each section in said pair and rejecting the detector in response to a predetermined disparity therebetween; and
   (e) evaluating the ratio of the cathode-cathode or anode-anode dark resistance of each adjacent section pair with the cathode-cathode or anode-anode dark resistance of that section pair having the highest cathode-cathode or anode-anode dark resistance and rejecting the detector in response to any such ratio being less than a predetermined value.

2. The method of claim 1 comprising the further steps of:
   (f) measuring the cathode-cathode or anode-anode dark resistance of each non-adjacent pair of sections and rejecting the detector in response to any such measured resistance being less than a predetermined value;
   (g) comparing the cathode-cathode or anode-anode dark resistance of each non-adjacent section pair with the sum of the cathode-anode dark resistances for each section in said pair and rejecting the detector in reponse to a predetermined disparity therebetween; and
   (h) evaluating the ratio of the cathode-cathode or anode-anode dark resistance of each non-adjacent section pair with the cathode-cathode or anode-anode dark resistance of that section pair having the highest cathode-cathode or anode-anode dark resistance and rejecting the detector in response to any such ratio being less than a predetermined value.

* * * * *